(12) United States Patent  
Nitsch (10) Patent No.: US 7,781,887 B2  
(45) Date of Patent: Aug. 24, 2010

(54) SEMICONDUCTOR DEVICE INCLUDING AN INTERCONNECT (75) Inventor: Alois Nitsch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/178,307

(22) Filed: Jul. 23, 2008

(65) Prior Publication Data

US 2008/0277801 A1 Nov. 13, 2008

(51) Int. Cl.
| | |
|---|---|
| H01L 23/34 | (2006.01) |
| H01L 23/02 | (2006.01) |
| H01L 23/48 | (2006.01) |
| H01L 23/52 | (2006.01) |
| H01L 29/40 | (2006.01) |

(52) U.S. Cl. .................. 257/725; 257/685; 257/686; 257/723; 257/758; 257/777; 257/778; 257/E27.137; 257/E27.144; 257/E27.161

(58) Field of Classification Search ......... 257/685–686, 257/723, 725, 777–778, E27.137, E27.144, 257/E27.161, 758

See application file for complete search history.

(56) References Cited

U.S. PATENT DOCUMENTS

| | | | |
|---|---|---|---|
| 5,485,039 A * | 1/1996 | Fujita et al. ............... 257/774 |
| 6,326,241 B1 | 12/2001 | Belke, Jr. et al. | |
| 6,383,837 B1 * | 5/2002 | Tsunashima ............... 438/106 |
| 6,410,415 B1 | 6/2002 | Estes et al. | |
| 6,566,232 B1 * | 5/2003 | Hara et al. ................. 438/455 |
| 6,982,487 B2 * | 1/2006 | Kim et al. .................. 257/774 |
| 7,159,313 B2 | 1/2007 | Sathe et al. | |
| 7,241,641 B2 | 7/2007 | Savastiouk et al. | |
| 7,271,482 B2 * | 9/2007 | Kirby ........................ 257/736 |
| 7,317,256 B2 * | 1/2008 | Williams et al. ............ 257/777 |
| 7,355,273 B2 * | 4/2008 | Jackson et al. ............. 257/686 |
| 7,402,903 B2 * | 7/2008 | Matsuo ..................... 257/698 |
| 2005/0248021 A1 * | 11/2005 | Morkner ................... 257/686 |
| 2006/0012021 A1 * | 1/2006 | Larson, et al. ............. 257/686 |
| 2007/0222054 A1 * | 9/2007 | Hembree ................... 257/686 |
| 2009/0020855 A1 * | 1/2009 | Pyeon ....................... 257/621 |

FOREIGN PATENT DOCUMENTS

JP 10312980 A * 11/1998

OTHER PUBLICATIONS

Wolf et al., Thru—Silicon Via Technology: R&D at Fraunhofer IZM, EMC-3D SE Asian Technical Symposium, Jan. 2007, 19 pages.

* cited by examiner

*Primary Examiner*—Ida M Soward  
(74) *Attorney, Agent, or Firm*—Dicke, Billig & Czaja, PLLC (57) ABSTRACT

A semiconductor device includes a first die, a substrate, and a first interconnect. The first die includes a first isolation region and a first contact at least partially overlapping the first isolation region. The substrate includes a second contact. The first interconnect couples the first contact to the second contact. The first interconnect is defined by a via through the first isolation region.

25 Claims, 6 Drawing Sheets

Fig. 15

SEMICONDUCTOR DEVICE INCLUDING AN INTERCONNECT

BACKGROUND

A system-on-a-chip (SoC) integrates different technologies, such as digital circuits, analog circuits, mixed-signal circuits, memory circuits, etc., into a single semiconductor chip. A SoC is typically used in embedded applications to reduce the space and power requirements of the system and to reduce the assembly costs of the system compared to using multiple semiconductor chips to achieve the same function as the SoC. SoCs are typically expensive to fabricate due to the multiple technologies (e.g., analog, digital, etc.) included on a single semiconductor chip and due to the typically lower yields achieved when multiple technologies are combined on a single semiconductor chip.

An alternative to SoCs is two or more stacked semiconductor chips, which can provide similar functions as a SoC in a small package. Each semiconductor chip within the stack of semiconductor chips may include a single technology, thereby reducing the cost of each semiconductor chip and typically increasing the yields. To interconnect the semiconductor chips within a stack of semiconductor chips, however, specialized tools and/or expensive processes are typically used.

For these and other reasons, there is a need for the present invention.

SUMMARY

One embodiment provides a semiconductor device. The semiconductor device includes a first die, a substrate, and a first interconnect. The first die includes a first isolation region and a first contact at least partially overlapping the first isolation region. The substrate includes a second contact. The first interconnect couples the first contact to the second contact. The first interconnect is defined by a via through the first isolation region.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
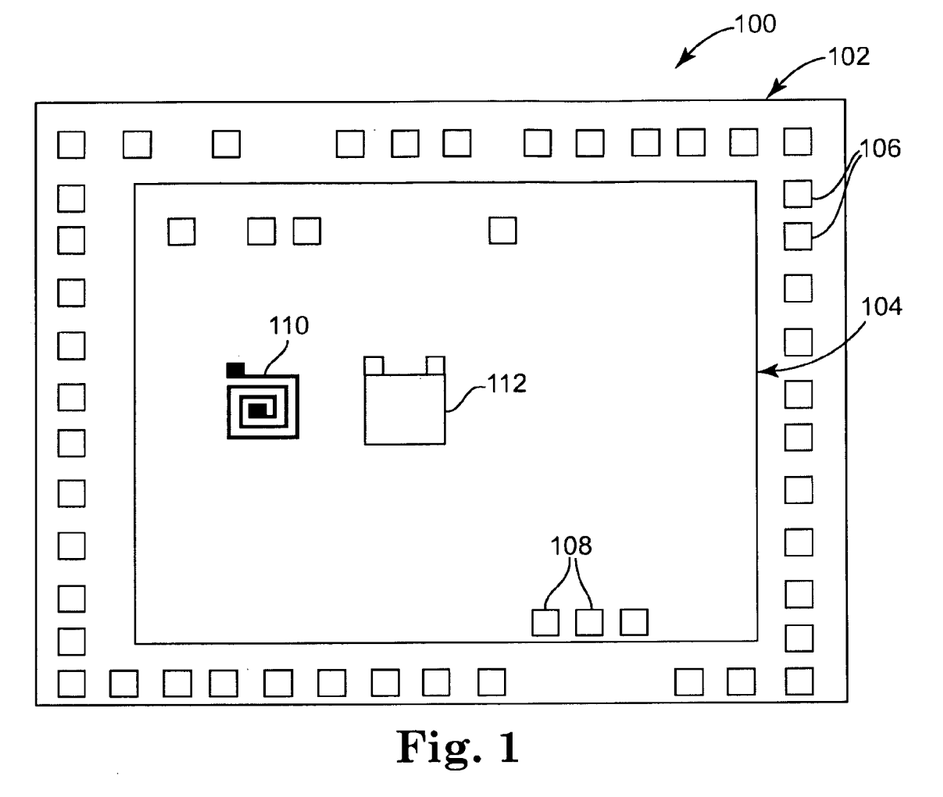
FIG. 1 illustrates a top view of one embodiment of a semiconductor device.

FIG. 1 illustrates a top view of one embodiment of a semiconductor device 100. Semiconductor device 100 includes a first semiconductor die or substrate 102 and a second semiconductor die or substrate 104. Second semiconductor die 104 is stacked on top of first semiconductor die 102 and is electrically interconnected to first semiconductor die 102. Passive components such as a coil 110 and a capacitor 112 are fabricated or stacked on top of second semiconductor die 104 and are electrically interconnected to second semiconductor die 104 and/or first semiconductor die 102.

Second semiconductor die 104 can be electrically interconnected to first semiconductor die 102 without using solder, electroplated contacts, bond wires, or thermal bonding processes. Second semiconductor die 104 is electrically interconnected to first semiconductor die 102 through one or more interconnects, where each interconnect is defined by a via through an isolation region of second semiconductor die 104.

In one embodiment, first semiconductor die 102 includes a plurality of bond pads 106, and second semiconductor die 104 includes a plurality of bond pads 108. In another embodiment, first semiconductor die 102 does not include bond pads 106, and second semiconductor die 104 includes bond pads 108. In another embodiment, first semiconductor die 102 includes bond pads 106, and second semiconductor die 104 does not include bond pads 108. Bonds pads 106 and 108 comprise aluminum, copper, or another suitable material.

In one embodiment, first semiconductor die 102 and second semiconductor die 104 are fabricated using different technologies. For example, in one embodiment, one of the semiconductor die includes a digital circuit, and the other one of the semiconductor die includes an analog circuit. In another embodiment, one of the semiconductor die includes a processor, and the other one of the semiconductor die includes a memory. In another embodiment, one of the semiconductor die includes elements having a first minimum dimension, and the other one of the semiconductor die includes elements having a second minimum dimension different from the first minimum dimension. In other embodiments, other suitable combinations of semiconductor die are used. By fabricating semiconductor die using different technologies separately and then combining them as illustrated in FIG. 1, the cost of producing a system having functionality similar to a system-on-a-chip (SoC) is reduced compared to a comparable SoC.

Figure 2A:
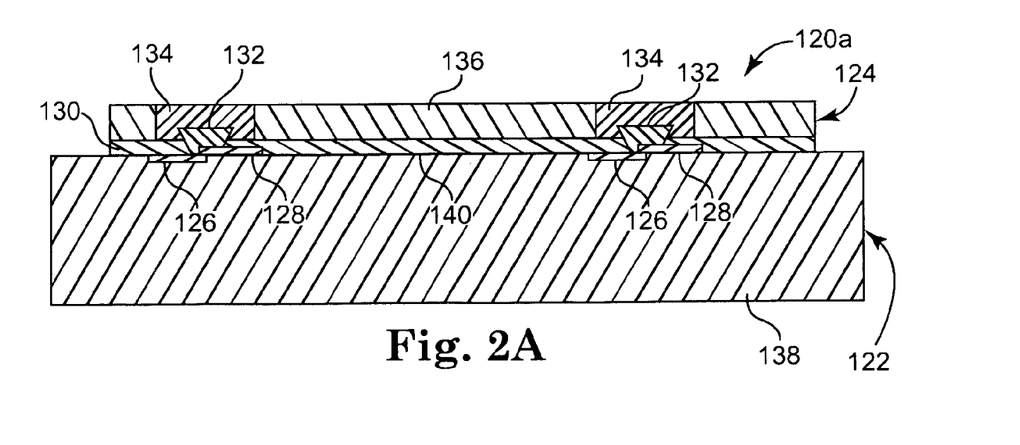
FIG. 2A illustrates a cross-sectional view of one embodiment of a semiconductor device.

FIG. 2A illustrates a cross-sectional view of one embodiment of a semiconductor device 120a. Semiconductor device 120a includes a first semiconductor die or substrate 122 and a second semiconductor die or substrate 124. Second semiconductor die 124 is stacked on top of first semiconductor die 122 and is electrically interconnected to first semiconductor die 122. Second semiconductor die 124 is electrically interconnected to first semiconductor die 122 without using solder, electroplated contacts, bond wires, or thermal bonding processes.

First semiconductor die 122 includes a substrate 138, such as a silicon substrate or other suitable substrate, contacts 126, and other circuitry and/or metallization layers (not shown). Second semiconductor die 124 includes a thinned substrate 136, isolation regions 134, interconnects 132, and a back-end-of-line (BEOL) stack 130 including contacts 128. In one embodiment, BEOL stack 130 interconnects active components (not shown) formed in substrate 136.

First semiconductor die 122 is bonded to second semiconductor die 124 at interface 140. In one embodiment, first semiconductor die 122 is adhesively bonded to second semiconductor die 124 at interface 140. In another embodiment, first semiconductor die 122 is directly bonded to second semiconductor die 124 at interface 140. In another embodiment, first semiconductor die 122 is bonded to second semiconductor die 124 via direct metal bonding. In other embodiments, first semiconductor die 122 is bonded to second semiconductor die 124 using another suitable bonding process.

Contacts 126 of first semiconductor die 122 at least partially overlap and contact contacts 128 of second semiconductor die 124 along interface 140. In one embodiment, contacts 126 and 128 include aluminum, copper, tungsten, or another suitable electrically conductive material and are not electroplated. An interconnect 132 electrically couples each contact 126 to contact 128. Interconnect 132 includes aluminum, copper, tungsten, or another suitable electrically conductive material. Interconnects 132 are provided within vias formed within isolation regions 134.

Figure 2B:
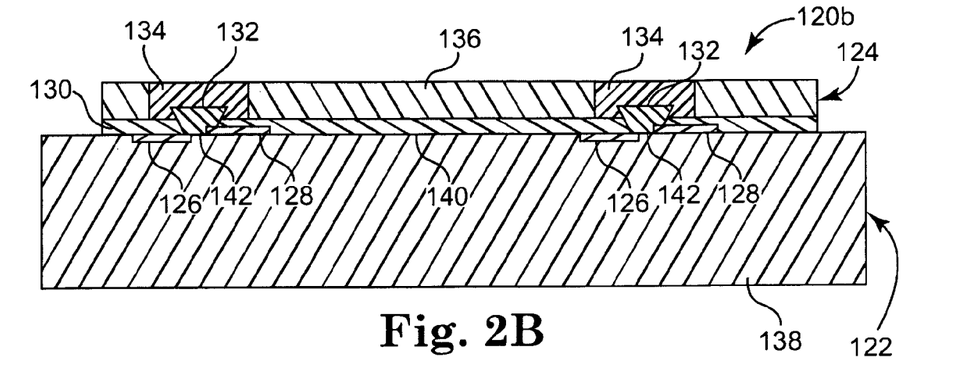
FIG. 2B illustrates a cross-sectional view of another embodiment of a semiconductor device.

FIG. 2B illustrates a cross-sectional view of another embodiment of a semiconductor device 120b. Semiconductor device 120b is similar to semiconductor device 120a previously described and illustrated with reference to FIG. 2A except that in semiconductor device 120b, contacts 126 of first semiconductor die 122 do not overlap contacts 128 of second semiconductor die 124 along interface 140. Rather, in this embodiment, a gap 142 separates each contact 126 from contact 128. Interconnect 132 electrically couples each contact 126 to contact 128.

The following FIGS. 3-15 illustrate embodiments of a process for fabricating a semiconductor device, such as semiconductor device 100 previously described and illustrated with reference to FIG. 1 or semiconductor device 120a previously described and illustrated with reference to FIG. 2A. While the following FIGS. 3-15 illustrate embodiments where each contact 126 overlaps a contact 128, the embodiments of the process are also applicable for fabricating semiconductor device 120b previously described and illustrated with reference to FIG. 2B.

Figure 3:
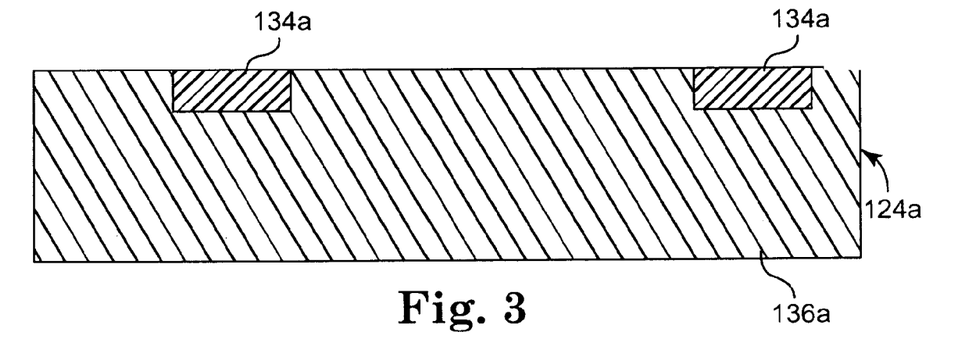
FIG. 3 illustrates a cross-sectional view of one embodiment of a substrate including isolation regions.

FIG. 3 illustrates a cross-sectional view of one embodiment of a substrate 124a including isolation regions 134a. In one embodiment, substrate 124a includes a silicon substrate 136a. In one embodiment, substrate 124a is a wafer. Portions of silicon substrate 136a are etched to provide openings or trenches within silicon substrate 136a. A dielectric material, such as $SiO_2$, SiN, or another suitable dielectric material is deposited over silicon substrate 136a and into the openings to provide a dielectric material layer. The dielectric material layer is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVP), spin-on, or other suitable deposition technique. The dielectric material layer is then planarized to expose silicon substrate 136a and to provide isolation regions 134a. The dielectric material layer is planarized using chemical mechanical planarization (CMP) or another suitable planarization technique.

Figure 4:
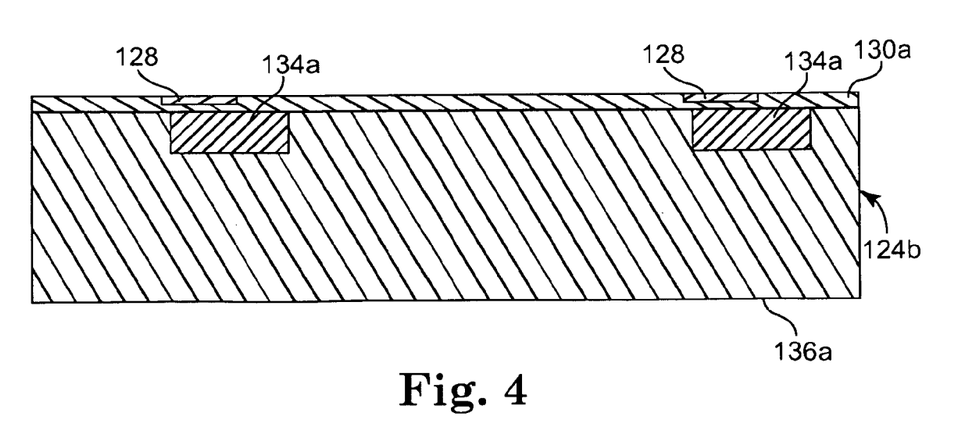
FIG. 4 illustrates a cross-sectional view of one embodiment of a semiconductor chip or die.

FIG. 4 illustrates a cross-sectional view of one embodiment of a semiconductor chip or die 124b. Semiconductor die 124b includes silicon substrate 136a, isolation regions 134a, and BEOL stack 130a including contacts 128. Active structures (not shown) are formed in silicon substrate 136a. BEOL stack 130a is formed over silicon substrate 136a and isolation regions 134a. BEOL stack 130a interconnects the active structures formed in silicon substrate 136a and includes contacts 128. Contacts 128 are formed at least partially over isolation regions 134a. Contacts 128 include aluminum, copper, tungsten, or another suitable electrically conductive material. Contacts 128 are electrically coupled to circuits within semiconductor die 124b. In one embodiment, semiconductor die 124b is then separated from other semiconductor die fabricated on the same wafer as semiconductor die 124b.

Figure 5:
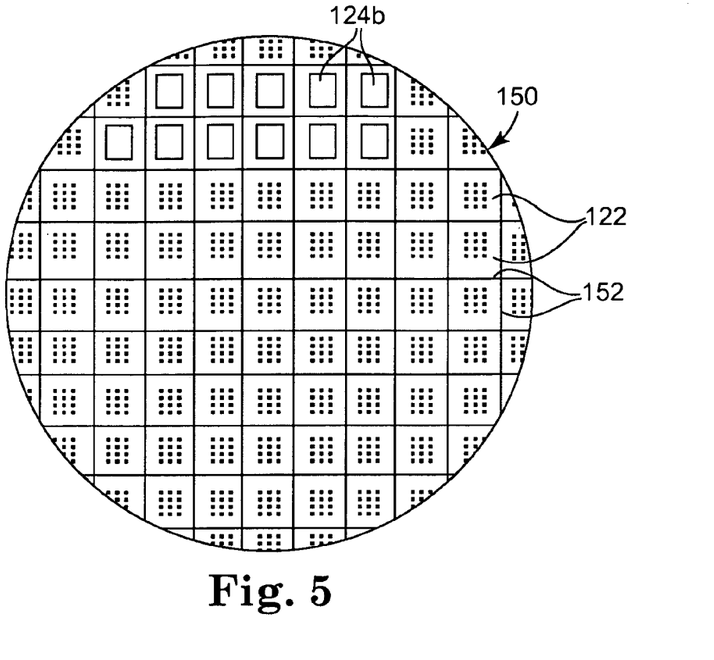
FIG. 5 illustrates a top view of one embodiment of a wafer with several semiconductor die placed on the wafer.

FIG. 5 illustrates a top view of one embodiment of a wafer 150 with several semiconductor die 124b placed on wafer 150. In one embodiment, wafer 150 includes a plurality of semiconductor die 122 as previously described and illustrated with reference to FIG. 2 before separation. Each semiconductor die 122 is fabricated adjacent other semiconductor die 122 and includes borders as indicated at 152. Each semiconductor die 124b is flipped over and bonded to a semiconductor die 122 on wafer 150.

Figure 6:
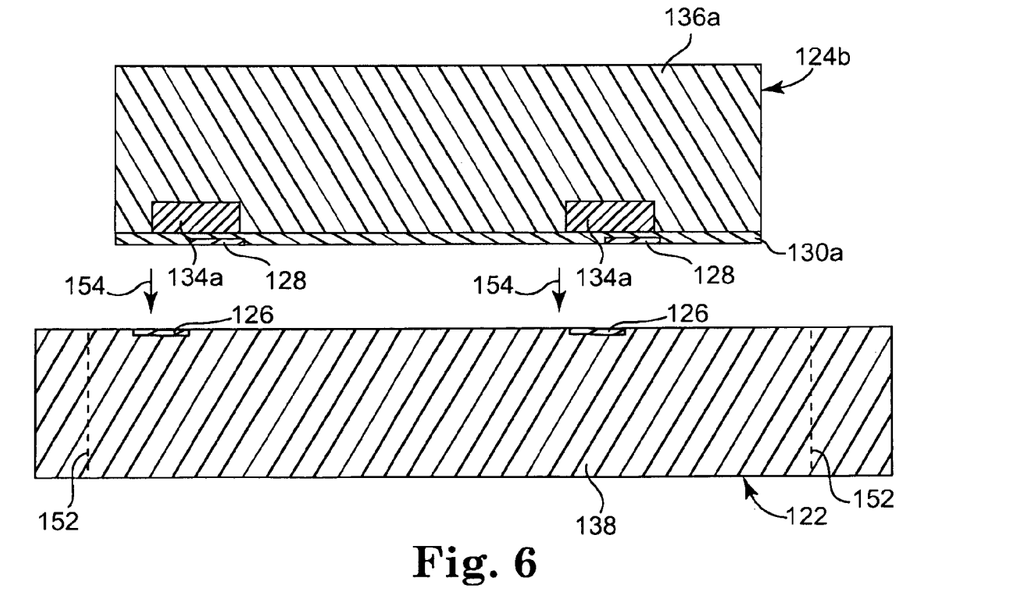
FIG. 6 illustrates a cross-sectional view of one embodiment of placing a semiconductor die on another semiconductor die.

FIG. 6 illustrates a cross-sectional view of one embodiment of placing a semiconductor die 124b on a semiconductor die 122. Each semiconductor die 124b is flipped over and placed onto a semiconductor die 122 as indicated by arrows 154. Each semiconductor die 124b is placed such that each contact 128 at least partially overlaps a contact 126 of semiconductor die 122. Precise placement of each semiconductor die 124b on a semiconductor die 122 is not necessary as long as each contact 128 at least partially overlaps a contact 126 of semiconductor die 122.

Figure 7:
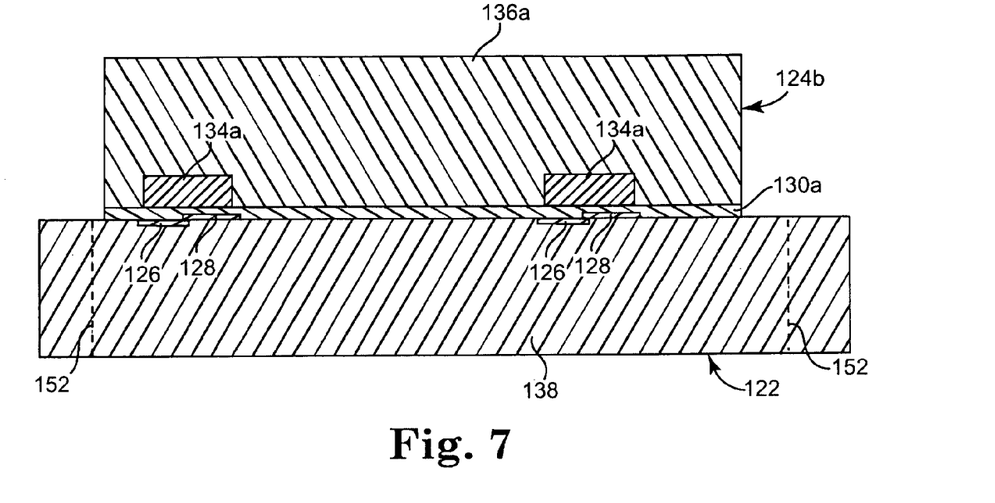
FIG. 7 illustrates a cross-sectional view of one embodiment of a semiconductor die bonded to another semiconductor die.

FIG. 7 illustrates a cross-sectional view of one embodiment of semiconductor die 124b bonded to semiconductor die 122. Semiconductor die 124b is bonded to semiconductor die 122 via adhesive bonding, direct bonding, such as direct metal bonding, or another suitable process.

Figure 8:
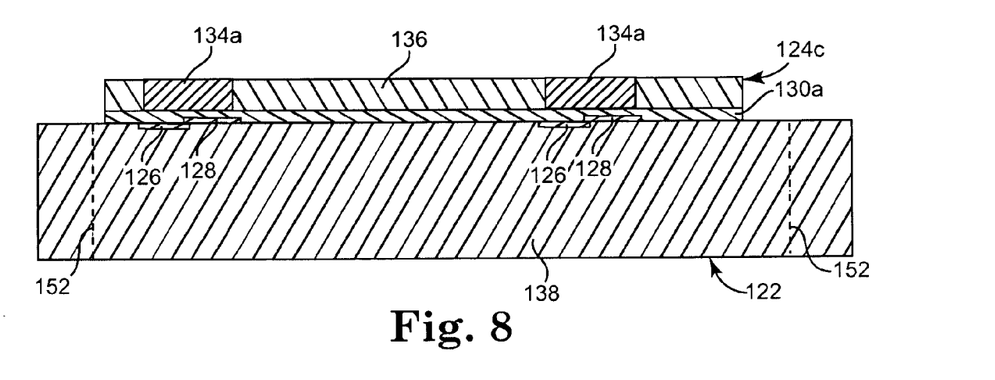
FIG. 8 illustrates a cross-sectional view of one embodiment of a thinned semiconductor die bonded to another semiconductor die.

FIG. 8 illustrates a cross-sectional view of one embodiment of a thinned semiconductor die 124c bonded to a semiconductor die 122. Silicon substrate 136a of semiconductor die 124b is thinned to expose isolation regions 134a and to provide thinned silicon substrate 136 and thinned semiconductor die 124c. Silicon substrate 136a is thinned by grinding or by using another suitable process. Since semiconductor die 124b is thinned after semiconductor die 124b is bonded to semiconductor die 122, handling of thinned semiconductor die is avoided.

Figure 9:
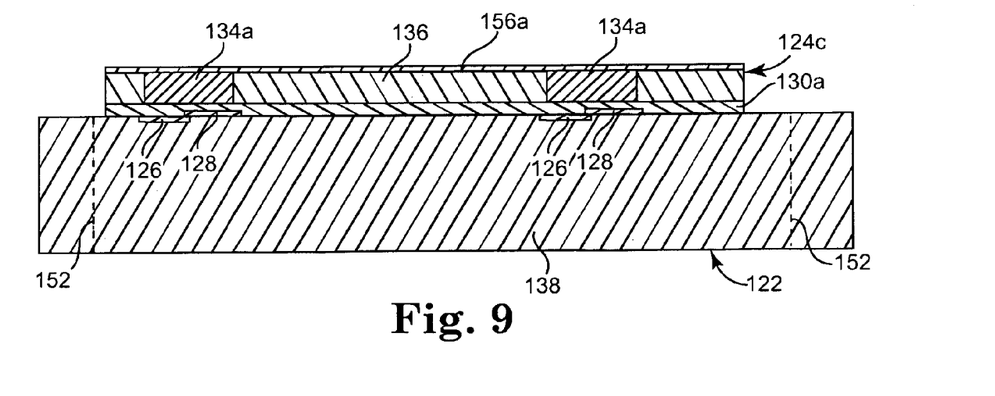
FIG. 9 illustrates a cross-sectional view of one embodiment of a mask material layer over the thinned semiconductor die.

FIG. 9 illustrates a cross-sectional view of one embodiment of a mask material layer 156a over thinned semiconductor die 124c. A photo sensitive material or another suitable mask material is deposited over thinned die 124c to provide mask material layer 156a. Mask material layer 156a is deposited using spin-on or another suitable deposition technique.

Figure 10:
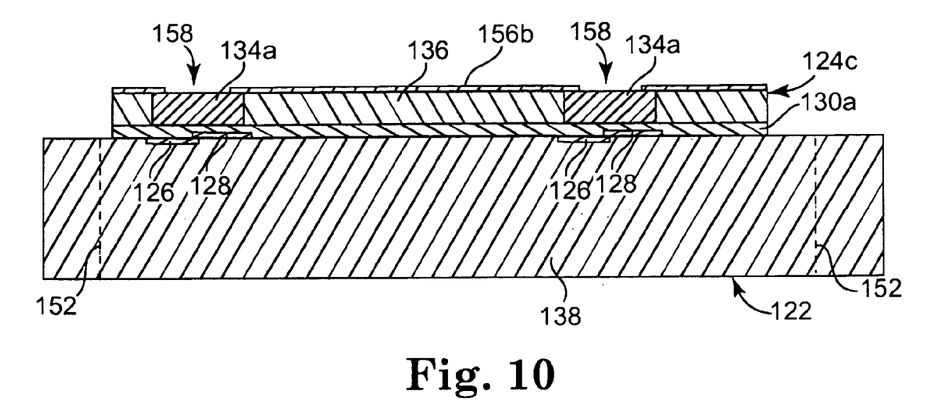
FIG. 10 illustrates a cross-sectional view of one embodiment of the mask material layer after removing portions of the mask material layer.

FIG. 10 illustrates a cross-sectional view of one embodiment of mask material layer 156b after removing portions of mask material layer 156a. Mask material layer 156a is structured to provide openings 158 exposing at least a portion of each isolation region 134a and to provide mask material layer 156b. Mask material layer 156a is structured using a photolithography process or another suitable process.

Figure 11:
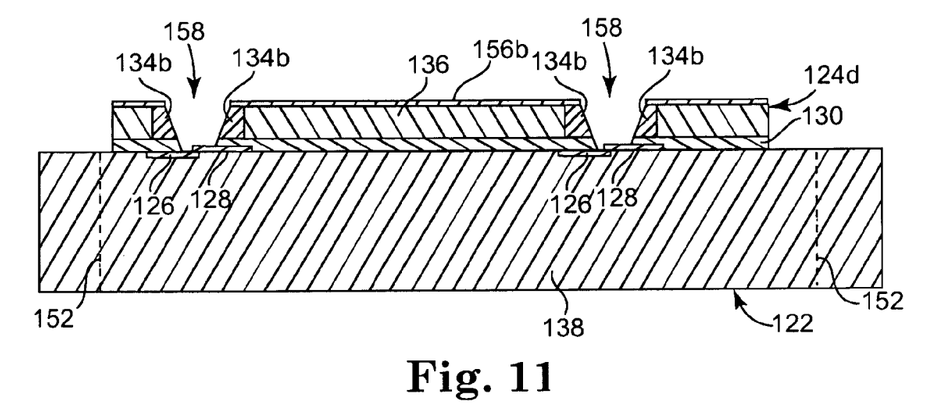
FIG. 11 illustrates a cross-sectional view of one embodiment of the thinned semiconductor die after etching exposed portions of the isolation regions.

FIG. 11 illustrates a cross-sectional view of one embodiment of thinned semiconductor die 124d after etching exposed portions of isolation regions 134a. The exposed portions of isolation regions 134a and the underlying portions of BEOL stack 130a are etched to expose at least a portion of each contact 126 and 128 and to provide isolation regions 134b, BEOL stack 130, and thinned semiconductor die 124d. In one embodiment, the sidewalls of openings 158 within isolation regions 134b and BEOL stack 130 are tapered. In another embodiment, the sidewalls of openings 158 are substantially vertical.

Figure 12:
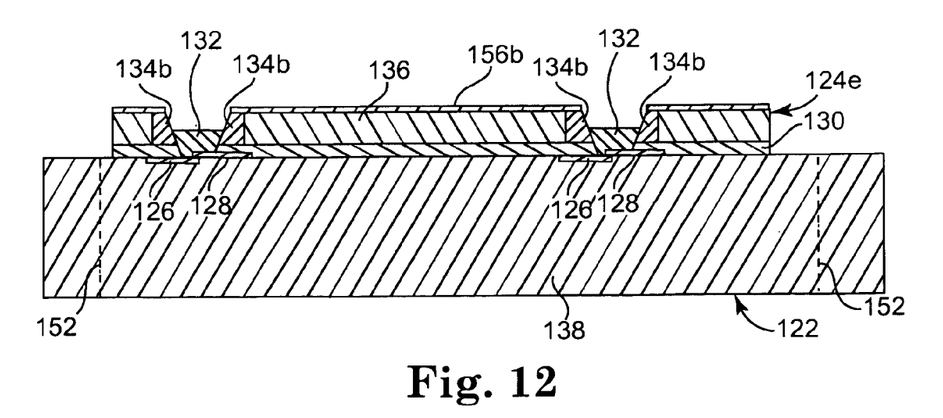
FIG. 12 illustrates a cross-sectional view of one embodiment of the thinned semiconductor die after interconnecting the thinned semiconductor die to another semiconductor die.

FIG. 12 illustrates a cross-sectional view of one embodiment of thinned semiconductor die 124e after interconnecting thinned semiconductor die 124d to semiconductor die 122. An electrically conductive material, such as aluminum, copper, tungsten, or another suitable material is deposited into openings 158 over contacts 126 and 128 to provide interconnects 132. Each interconnect 132 electrically couples contact 126 to contact 128 to electrically interconnect semiconductor die 122 to semiconductor die 124e. The electrically conductive material is deposited using CVD, HDP-CVD, ALD, MOCVD, PVD, JVP, electroless plating, or other suitable deposition technique.

In one embodiment, the electrically conductive material is deposited over mask material layer 156b and into openings 158. In this embodiment, the electrically conductive material is then recess etched to provide interconnects 132. In another embodiment, the electrically conductive material is planarized to expose mask material layer 156b and to provide interconnects filling openings 158. The electrically conductive material is planarized using CMP or another suitable planarization technique. In other embodiments, mask material layer 156b is removed before depositing the electrically conductive material to provide interconnects 132.

Figure 13:
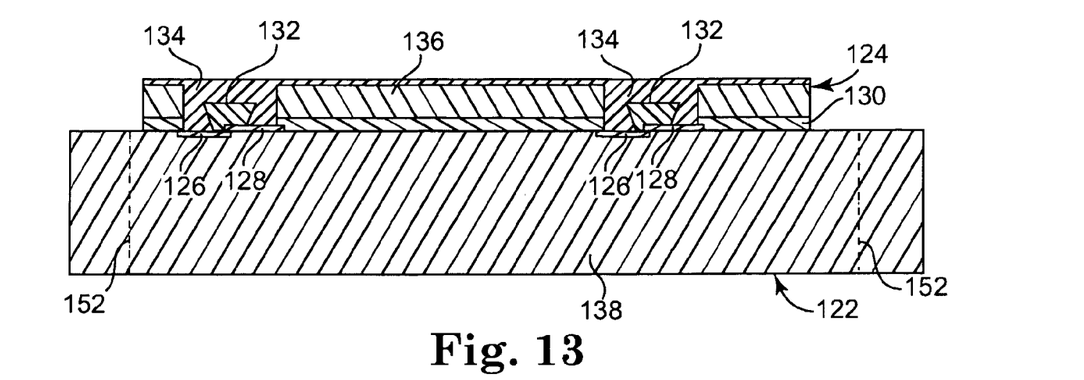
FIG. 13 illustrates a cross-sectional view of one embodiment of the thinned semiconductor die after depositing isolation material over the thinned semiconductor die.

FIG. 13 illustrates a cross-sectional view of one embodiment of thinned semiconductor die 124 after depositing isolation material over thinned semiconductor die 124. A dielectric material, such as $SiO_2$, SiN, or another suitable dielectric material is deposited over silicon substrate 136, isolation regions 134b, and interconnects 132 to provide a dielectric material layer. The dielectric material layer is deposited using CVD, HDP-CVD, ALD, MOCVD, PVD, JVP, spin-on, or other suitable deposition technique. The dielectric material layer is then planarized to provide isolation regions 134. The dielectric material layer is planarized using CMP or another suitable planarization technique. In one embodiment, the dielectric material layer is planarized to expose substrate 136. In another embodiment, a layer of dielectric material remains over substrate 136 after planarization to prepare semiconductor die 124 for additional semiconductor die or passive components to be stacked on semiconductor die 124.

Figure 14:
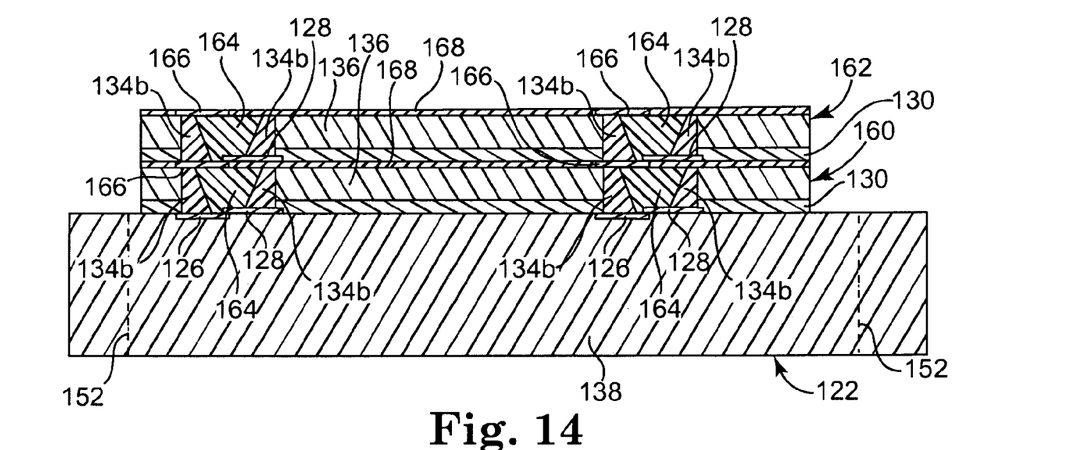
FIG. 14 illustrates a cross-sectional view of one embodiment of two thinned semiconductor die stacked on another semiconductor die.

FIG. 14 illustrates a cross-sectional view of one embodiment of two thinned semiconductor die 160 and 162 stacked on semiconductor die 122. Each semiconductor die 160 and 162 is similar to semiconductor die 124 previously described and illustrated with reference to FIG. 13 except that interconnects 132 are replaced with interconnects 164. In addition, interconnects 164 are electrically coupled to contacts 166 within semiconductor die 160 and 162.

Semiconductor die 160 is fabricated, bonded, and electrically interconnected to die 122 using a process similar to the process previously described and illustrated with reference to FIGS. 3-12. Contacts 166 are formed on die 160 and are electrically coupled to interconnects 164. Isolation material 168 latterly surrounds contacts 166. A process similar to the process previously described and illustrated with reference to FIGS. 3-12 is then repeated to fabricate, bond, and electrically interconnect semiconductor die 162 to semiconductor die 160. Any suitable number of semiconductor die can be stacked on die 122. Each semiconductor die in the stack is electrically interconnected to one or more of the lower semiconductor die in the stack.

Figure 15:
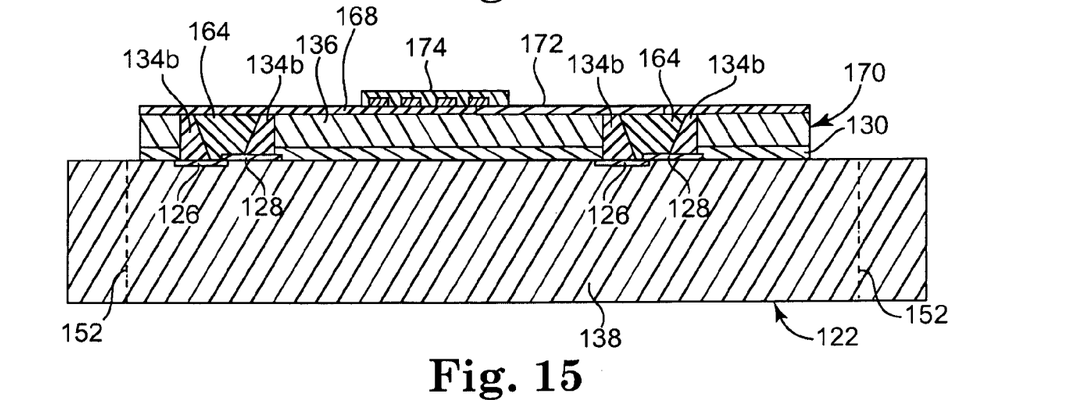
FIG. 15 illustrates a cross-sectional view of one embodiment of a passive component stacked over a thinned semiconductor die.

FIG. 15 illustrates a cross-sectional view of one embodiment of a passive component 174 stacked over a thinned semiconductor die 170. Thinned semiconductor die 170 is similar to thinned semiconductor die 160 previously described and illustrated with reference to FIG. 14 except that a contact 166 is replaced with a contact 172. Contact 172 is fabricated over substrate 136 and is electrically coupled to an interconnect 164. Contact 172 is laterally surrounded by isolation material 168. In one embodiment, a passive component 174 is fabricated over isolation material 168 and at least a portion of contact 172 using semiconductor processes. In another embodiment, a passive component 174 is bonded to isolation material 168 and at least a portion of contact 172. Contact 172 electrically couples interconnect 164 and therefore semiconductor die 170 and semiconductor die 122 to passive component 174. Passive component 174 includes a coil, a capacitor, or another suitable component.

Embodiments provide semiconductor devices including thinned semiconductor die or substrates stacked over and electrically interconnected to one or more other semiconductor die or substrates. Other embodiments provide passive components stacked over and electrically interconnected to one or more thinned semiconductor die or substrates. The electrical interconnects between the stacked elements are defined by vias formed in isolation regions. The electrical interconnects between the stacked elements are provided without using solder, electroplated contacts, bond wires, or thermal bonding processes. Therefore, specialized tools are not needed to interconnect the stacked elements, thereby reducing the fabrication costs compared to typical methods.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a first die comprising a first isolation region and a first contact at least partially overlapping the first isolation region;
   a substrate comprising a second contact; and
   a first interconnect coupling the first contact to the second contact, the first interconnect defined by a via through the first isolation region;
   wherein the first contact contacts the second contact at an interface between the first die and the substrate.

2. The semiconductor device of claim 1, wherein the first die is bonded to the substrate via one of adhesive bonding and direct metal bonding.

3. The semiconductor device of claim 1, wherein the first die comprises a third contact, and wherein the semiconductor device further comprises:
   a second die comprising a second isolation region and a fourth contact at least partially overlapping the second isolation region; and
   a second interconnect coupling the third contact to the fourth contact, the second interconnect defined by a via through the second isolation region.

4. The semiconductor device of claim 1, further comprising:
   a passive component attached to the first die and electrically coupled to the first interconnect.

5. The semiconductor device of claim 1, wherein the first die comprises a digital circuit, and
   wherein the substrate is a die comprising an analog circuit.

6. The semiconductor device of claim 1, wherein the first die comprises a memory, and
   wherein the substrate is a die comprising a processor.

7. The semiconductor device of claim 1, wherein the first die comprises a back-end-of-line (BEOL) region contacting the first isolation region, the BEOL region comprising the first contact, and
   wherein the first interconnect is defined by a via through the first isolation region and the BEOL region.

8. The semiconductor device of claim 1, wherein the first interconnect comprises tapered sidewalls.

9. The semiconductor device of claim 1, wherein in a direction perpendicular to the interface, a thickness of the first die is greater than a thickness of the first interconnect.

10. A semiconductor device comprising:
    a first thinned die comprising a back-end-of-line (BEOL) region contacting an isolation region, the BEOL region comprising a first contact at least partially over the isolation region;
    a second die comprising a second contact at least partially contacting the first contact; and
    an interconnect contacting the first contact and the second contact, the interconnect in a via etched through the isolation region and the BEOL region.

11. The semiconductor device of claim 10, wherein the first die is bonded to the second die via one of adhesive bonding and direct metal bonding.

12. The semiconductor device of claim 10, wherein the first die comprises a bond pad, and
    wherein the second die comprises a bond pad.

13. The semiconductor device of claim 10, wherein the first die comprises a first circuit including elements having a first minimum dimension, and
    wherein the second die comprises a second circuit including elements having a second minimum dimension different from the first minimum dimension.

14. The semiconductor device of claim 10, further comprising:
    a passive component attached to the first die and electrically coupled to the first die.

15. The semiconductor device of claim 14, wherein the passive component comprises one of a capacitor and a coil.

16. A semiconductor device comprising:
    a thinned first substrate comprising a first isolation region and a first contact at least partially over the first isolation region;
    a second substrate comprising a second contact;
    means for bonding the first substrate to the second substrate; and
    means for interconnecting the first contact to the second contact;
    wherein the first contact contacts the second contact at an interface between the first substrate and the second substrate.

17. The semiconductor device of claim 16, further comprising:
    a passive component attached to the first die and electrically coupled to the means for interconnecting.

18. The semiconductor device of claim 16, wherein the first substrate comprises a third contact, and wherein the semiconductor device further comprises:
    a thinned third substrate comprising a second isolation region and a fourth contact at least partially over the second isolation region;
    means for bonding the third substrate to the first substrate; and
    means for interconnecting the third contact to the fourth contact.

19. The semiconductor device of claim 16, wherein the first substrate comprises a back-end-of-line (BEOL) region contacting the first isolation region, the BEOL region comprising the first contact.

20. The semiconductor device of claim 16, wherein in a direction perpendicular to the interface, a thickness of the first substrate is greater than a thickness of the means for interconnecting the first contact to the second contact.

21. A semiconductor device comprising:
    a first die comprising an isolation region and a first contact at least partially overlapping the isolation region;
    a second die comprising a second contact; and
    an interconnect coupling the first contact to the second contact, the interconnect surrounded by the isolation region,
    wherein the first contact contacts the second die at an interface between the first die and the second die, and
    wherein the second contact contacts the first die at the interface.

22. The semiconductor device of claim 21, wherein the first contact contacts the second contact at the interface.

23. The semiconductor device of claim 21, wherein the first die comprises a back-end-of-line (BEOL) region contacting the isolation region, the BEOL region comprising the first contact, and wherein the interconnect is defined by a via through the isolation region and the BEOL region.

24. The semiconductor device of claim 21, wherein the interconnect comprises tapered sidewalls.

25. The semiconductor device of claim 21, wherein in a direction perpendicular to the interface, a thickness of the first die is greater than a thickness of the interconnect.

* * * * *